United States Patent
Shih et al.

(10) Patent No.: US 9,431,774 B2
(45) Date of Patent: Aug. 30, 2016

(54) UNIVERSAL SERIAL BUS SOCKET AND RELATED ELECTRONIC DEVICE

(71) Applicant: Wistron Corporation, New Taipei (TW)

(72) Inventors: Chia-Cheng Shih, New Taipei (TW); Kuo-Pao Sun, New Taipei (TW)

(73) Assignee: Wistron Corporation, New Taipei (TW)

( * ) Notice: Subject to any disclaimer, the term of this patent is extended or adjusted under 35 U.S.C. 154(b) by 216 days.

(21) Appl. No.: 13/726,528

(22) Filed: Dec. 24, 2012

(65) Prior Publication Data

US 2014/0078695 A1     Mar. 20, 2014

(30) Foreign Application Priority Data

Sep. 18, 2012   (TW) .............................. 101134112 A

(51) Int. Cl.
| | |
|---|---|
| H01R 13/66 | (2006.01) |
| H05K 5/00 | (2006.01) |
| G06F 1/16 | (2006.01) |
| H01R 24/60 | (2011.01) |
| H01R 13/639 | (2006.01) |

(52) U.S. Cl.
CPC ......... *H01R 13/6658* (2013.01); *G06F 1/1656* (2013.01); *H05K 5/0069* (2013.01); *H01R 13/639* (2013.01); *H01R 24/60* (2013.01); *H01R 2201/06* (2013.01)

(58) Field of Classification Search
CPC .... H01R 13/66; H01R 13/6658; H05K 5/00; H05K 5/0069
USPC ................................ 361/785; 439/76.1, 926
See application file for complete search history.

(56) References Cited

U.S. PATENT DOCUMENTS

| | | |
|---|---|---|
| 6,854,984 B1 | 2/2005 | Lee |
| 7,090,541 B1 | 8/2006 | Ho |
| 2006/0019513 A1* | 1/2006 | Mizuno ................. H01R 13/56 439/76.1 |

(Continued)

FOREIGN PATENT DOCUMENTS

| | | |
|---|---|---|
| CN | 202183489 U | 4/2012 |
| TW | M415458 | 11/2011 |
| TW | M434345 | 7/2012 |

OTHER PUBLICATIONS

Office action mailed on Nov. 18, 2014 for the Taiwan application No. 101134112, filing date: Sep. 18, 2012, p. 1 line 10-14, p. 2-4 and p. 5 line 1-20.
Office action mailed on Apr. 30, 2015 for the China application No. 201210369917.X, p. 3 line 3-31, p. 4-5 and p. 6 line 1-6.
Office action mailed on Nov. 26, 2012 for the China application No. 201210369917.X, p. 3 line 3-31, p. 4 and p. 5 line 1-29.

*Primary Examiner* — Jenny L Wagner
*Assistant Examiner* — Michael P McFadden
(74) *Attorney, Agent, or Firm* — Winston Hsu; Scott Margo

(57) ABSTRACT

A USB socket is disposed on a casing for connecting to a USB plug. The USB socket includes a piercing structure, a substrate and a plurality of terminals. The piercing structure is formed on a surface of the casing, and a main board is disposed inside the casing. An internal wall of the piercing structure can buckle the USB plug when the USB plug inserts into the piercing structure. The substrate is disposed on the main board and located inside the piercing structure. An integrated circuit is disposed on the substrate. The plurality of terminals is disposed on the substrate and coupled to the integrated circuit. The USB plug is electrically connected to the substrate and the terminals when the USB plug inserts into the piercing structure.

17 Claims, 7 Drawing Sheets

(56) References Cited

U.S. PATENT DOCUMENTS

| | | | |
|---|---|---|---|
| 2009/0093136 A1* | 4/2009 | Hiew et al. | 439/55 |
| 2010/0217910 A1* | 8/2010 | Bryant-Rich | G06F 13/409 710/301 |
| 2011/0103752 A1* | 5/2011 | Little et al. | 385/93 |
| 2012/0003852 A1* | 1/2012 | Chang | H01R 12/73 439/83 |
| 2012/0322282 A1* | 12/2012 | Naito | H01R 13/70369 439/137 |

* cited by examiner

UNIVERSAL SERIAL BUS SOCKET AND RELATED ELECTRONIC DEVICE

BACKGROUND OF THE INVENTION

1. Field of the Invention

The present invention relates to a universal serial bus socket, and more particularly, to a thin-type universal serial bus (USB) socket and a related electronic device.

2. Description of the Prior Art

Please refer to FIG. 1. FIG. 1 is a diagram of a USB socket 10 in the prior art. The conventional USB socket 10 includes a connecting plank 12 and a covering component 14. The connecting plank 12 is a circuit board whereon a plurality of terminals 16 is formed, and the connecting plank 12 is disposed inside the covering 14. Generally, the conventional USB socket 10 is applied to a computer device 18. An opening 201 is formed on a casing 20 of the computer device 18, and the conventional USB socket 10 is disposed inside the opening 201. When a USB plug inserts into the opening 201, the USB plug is engaged with the connecting plank 12, and the conventional USB socket 10 buckles the USB plug by the covering component 14. However, dimensions of the opening 201 on the casing 20 is substantially greater than the dimension of the covering 14, so that the casing 20 of the computer device 18 is huge and can not conform to the market trend of thin appearance.

SUMMARY OF THE INVENTION

The present invention provides a thin-type universal serial bus (USB) socket and a related electronic device for solving above drawbacks.

According to the claimed invention, a USB socket includes a piercing structure, a substrate and a plurality of terminals. The piercing structure is formed on a surface of a casing. Internal walls of the piercing structure buckles a USB plug when the USB plug inserts into the piercing structure. The substrate is disposed on a main board of the casing and located inside the piercing structure. An integrated circuit is disposed on a surface of the substrate. The plurality of terminals is disposed on the substrate and electrically connected to the integrated circuit. The USB plug is electrically connected to the substrate and the terminals when the USB plug inserts into the piercing structure.

According to the claimed invention, an aperture of the piercing structure is substantially equal to dimensions of the USB plug.

According to the claimed invention, the USB socket further includes a constraining structure disposed on a side of the substrate. The constraining structure contacts against the USB plug to constrain a movement of the USB plug relative to the substrate.

According to the claimed invention, the USB socket further includes a buckling structure disposed inside the piercing structure. The buckling structure fastens the USB plug with the substrate.

According to the claimed invention, the USB socket further includes at least one resilient pad disposed on the internal wall of the piercing structure. A thickness of the resilient pad is substantially greater than a distance between the USB plug and the internal wall.

According to the claimed invention, the USB socket further includes a skidproof component disposed inside the piercing structure. The skidproof component contacts against an upper side of the USB plug when the USB plug inserts into the piercing structure.

According to the claimed invention, the USB socket further includes a contacting structure disposed inside the piercing structure. The contacting structure contacts against a low side of the USB plug.

According to the claimed invention, an electronic device with USB connection includes a casing, a main board and a USB socket. The main board is disposed inside the casing. The USB socket is disposed on the casing for connecting to a USB plug. The USB socket includes a piercing structure, a substrate and a plurality of terminals. The piercing structure is formed on a surface of a casing. Internal walls of the piercing structure buckles a USB plug when the USB plug inserts into the piercing structure. The substrate is disposed on a main board of the casing and located inside the piercing structure. An integrated circuit is disposed on a surface of the substrate. The plurality of terminals is disposed on the substrate and electrically connected to the integrated circuit. The USB plug is electrically connected to the substrate and the terminals when the USB plug inserts into the piercing structure.

According to the claimed invention, an opening structure is disposed on a side of the main board, the substrate is disposed inside the opening structure, and the USB plug is locked by the main board and a lateral wall of the opening structure.

The present invention simplifies structure of the conventional socket, which means the present invention utilizes the casing of the electronic device to provide constraint on the USB plug. The present invention can decrease the structural dimensions of the USB socket, such as the thickness and the height of the USB socket, so as to economize inner space of the electronic device, and the electronic device of the present invention can conform to the market trend of thin-type computer for preferred competition.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
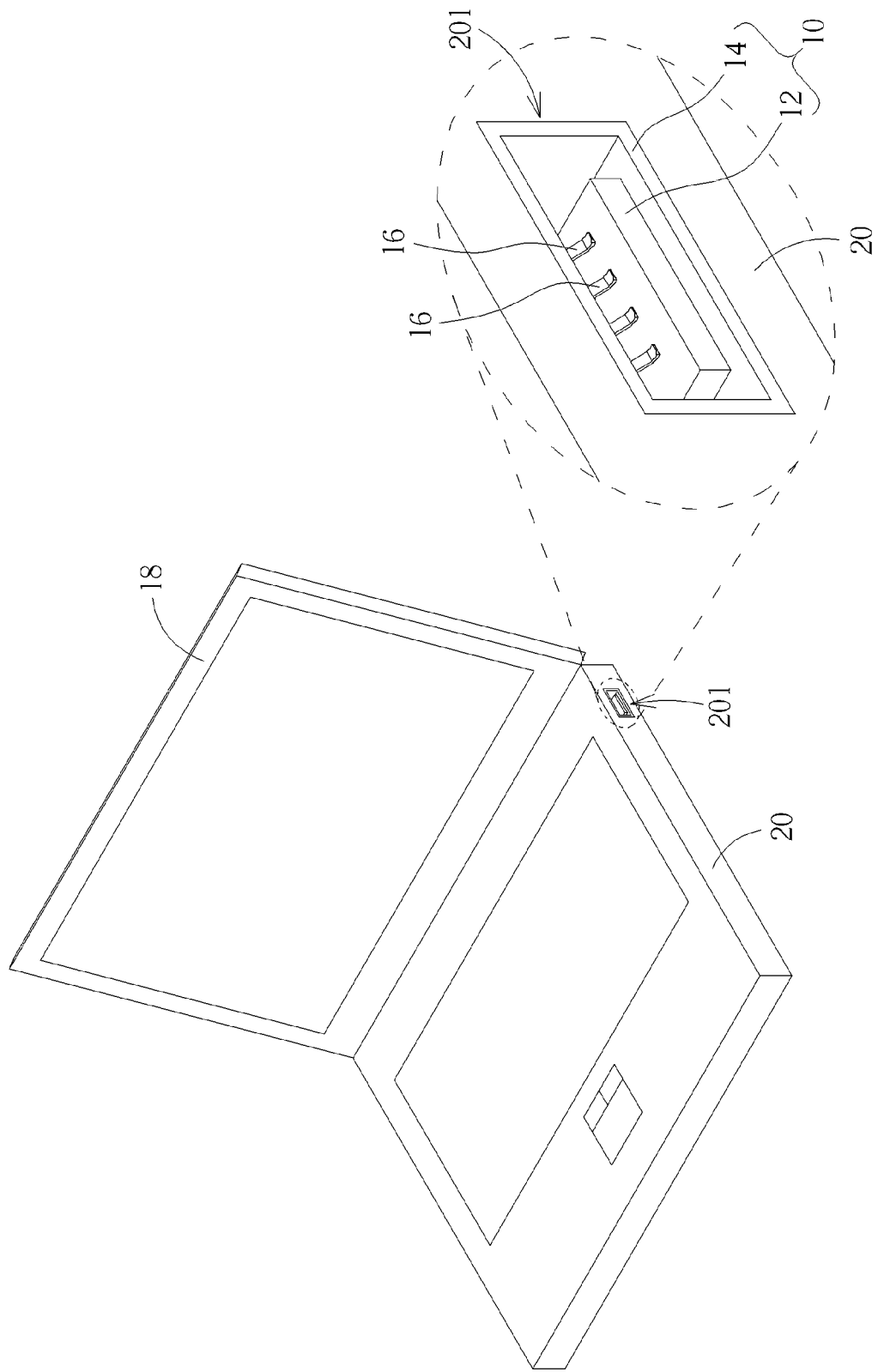
FIG. 1 is a diagram of a USB socket in the prior art.
Figure 2:
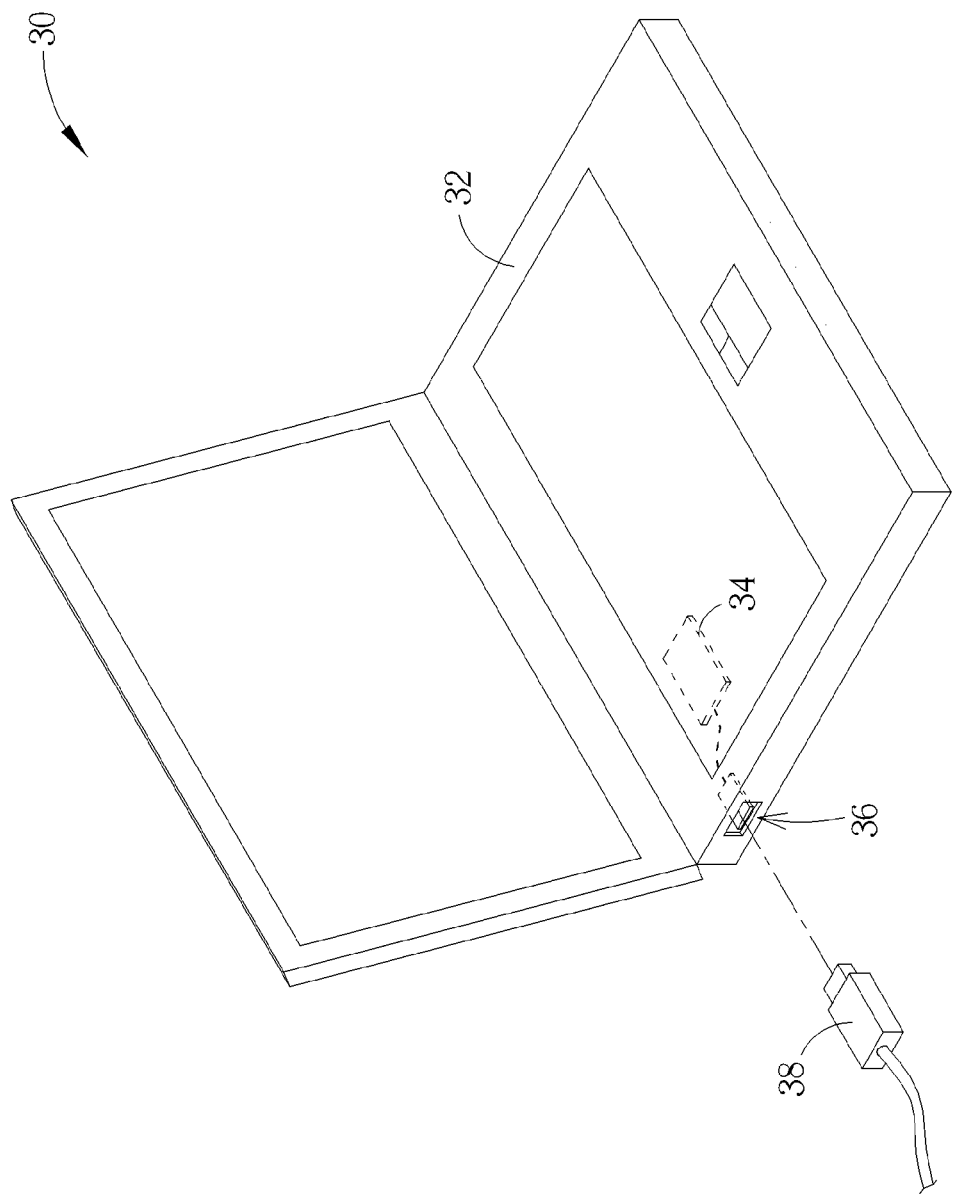
FIG. 2 is a diagram of an electronic device according to an embodiment of the present invention.

Please refer to FIG. 2. FIG. 2 is a diagram of an electronic device 30 according to an embodiment of the present invention. The electronic device 30 can be a notebook computer or a tablet computer. The electronic device 30 includes a casing 32 and a main board 34, and the main board 34 is disposed inside the casing 32. The electronic device 30 can further selectively include a plurality of electronic components, such as a processor, a memory module, a hard disk and so on. For convenient datum transmission, the electronic device 30 further includes a universal serial bus (USB) socket 36 disposed on a surface of the casing 32 for connecting to a USB plug 38.

The USB socket 36 and the USB plug 38 are widely applied to the personal computer and the portable computer.

Figure 3:
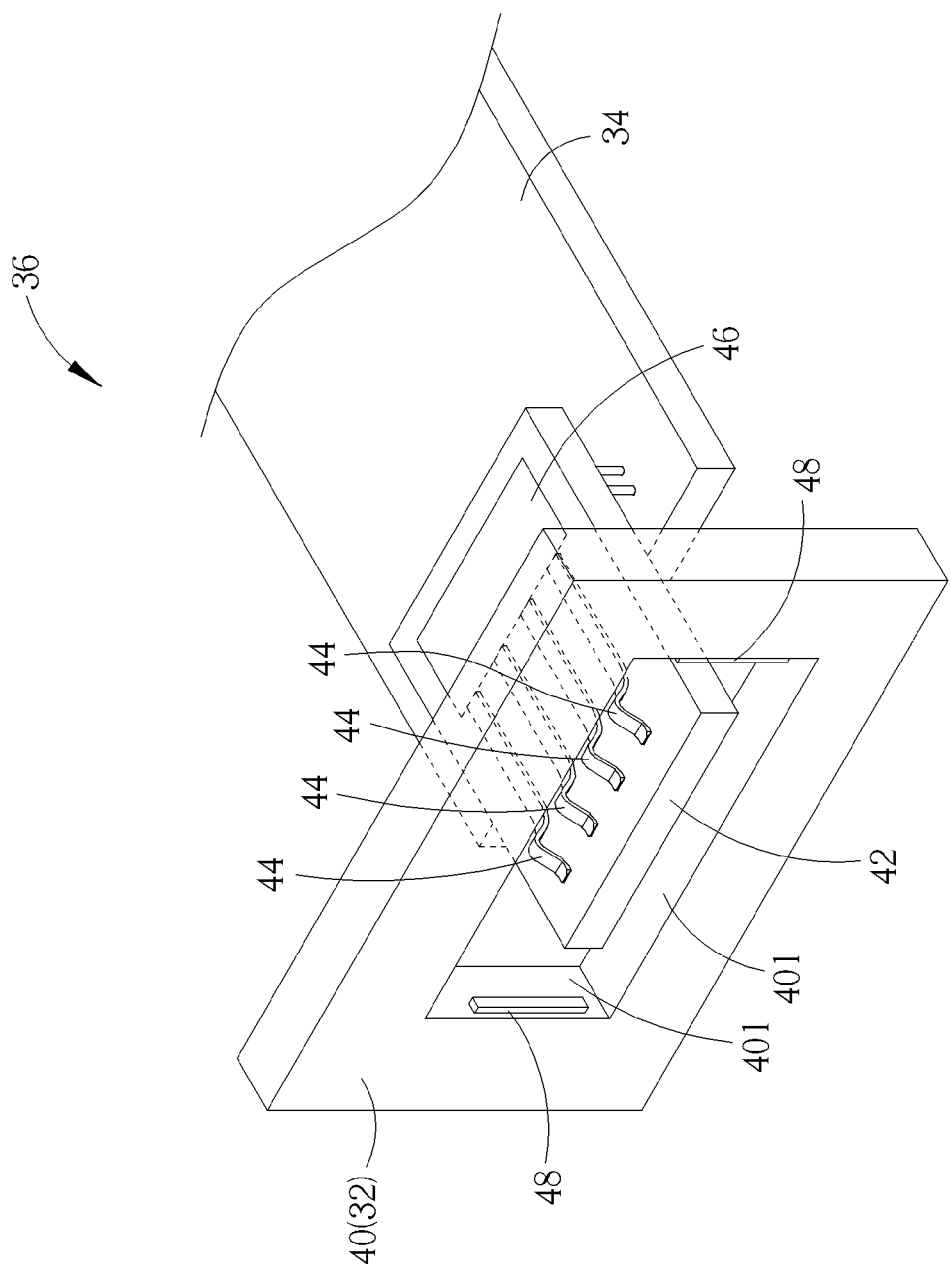
FIG. 3 is a diagram of a USB socket according to a first embodiment of the present invention.

Please refer to FIG. 2 and FIG. 3. FIG. 3 is a diagram of the USB socket 36 according to a first embodiment of the present invention. The USB socket 36 includes a piercing structure 40, a substrate 42 and a plurality of terminals 44. The piercing structure 40 is formed on the casing 32, or the piercing structure 40 can be part of the casing 32. The substrate 42 is disposed on the main board 34 and located inside the piercing structure 40. An integrated circuit 46 can be disposed on a surface of the substrate 42. The plurality of terminal 44 is disposed on the main board 34 and electrically connected to the integrated circuit 46. As the USB plug 38 inserts into the piercing structure 40, the USB plug 38 can be electrically connected to the substrate 42 and the plurality of terminals 44, so as to transmit a signal via the integrated circuit 46 and the main board 34.

An aperture of the piercing structure 40 (the length and the width of the aperture) can be respectively equal to external dimensions of the USB plug 38 (the length and the width of the USB plug 38). When the USB plug 38 inserts into the piercing structure 40, a plurality of internal walls 401 of the piercing structure 40 (an upper wall, a low wall and lateral walls) can tightly buckle the USB plug 38, so as to prevent separation of the USB plug 38 from the USB socket 36. In addition, the USB socket 36 can further selectively include a resilient pad 48 disposed on the internal wall 401 of the piercing structure 40. The resilient pad 48 can be made of resiliently deformable material. A thickness of the resilient pad 48 can be substantially greater than a distance between the USB plug 38 and the internal wall 401. Therefore, interference between the USB plug 38 and the resilient pad 48 is generated when the USB plug 38 inserts into the piercing structure 40. The resilient pad 48 is deformed by compression, and is fully filled between the USB plug 38 and the piercing structure 40, so as to effectively increase friction and to prevent the separation of the USB plug 38 from the piercing structure 40.

Figure 4:
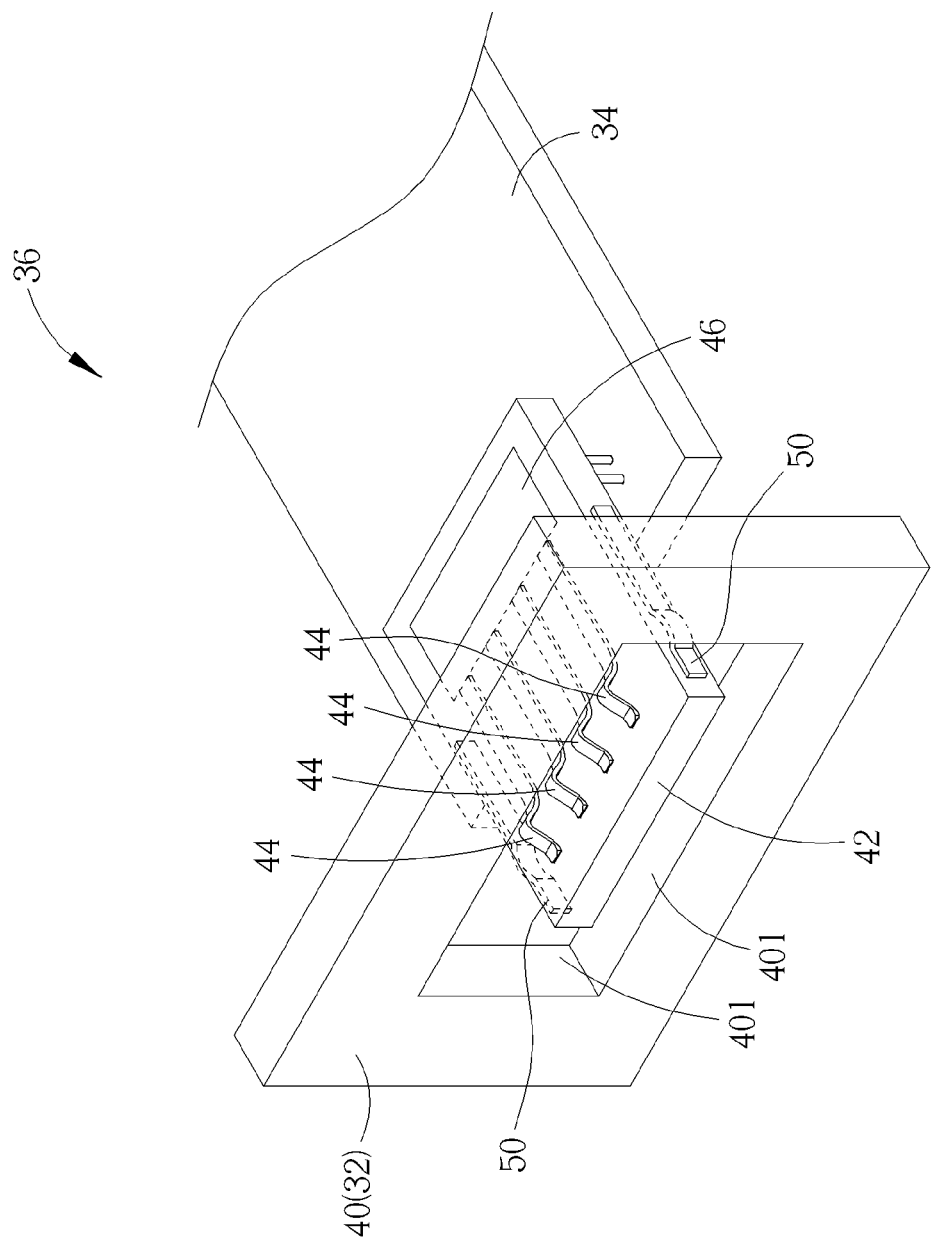
FIG. 4 is a diagram of the USB socket according to a second embodiment of the present invention.

Please refer to FIG. 4. FIG. 4 is a diagram of the USB socket 36 according to a second embodiment of the present invention. For buckling enhancement of the piercing structure 40 to the USB plug 38, the USB socket 36 can further include two constraining structures 50 respectively disposed on two opposite sides of the substrate 42. An amount of the constraining structure 50 is not limited to the above-mentioned embodiment, and depends on design demand. Each constraining structure 50 can be a curved component. Protrusion of the curved component can contact against the USB plug 38. As the USB plug 38 inserts into the piercing structure 40, the constraining structures 50 disposed on sides of the substrate 42 can be deformed by the USB plug 38, so as to stably immobilize the USB plug 38 for constraint of the USB plug 38 relative to the substrate 42. It should be mentioned that the constraining structures 50 are preferably disposed on the left side and the right side of the substrate 42, to effectively reduce a height of the USB socket 36, and the USB socket 36 of the prevent invention can be widely applied to the thin-type electronic device 30.

Figure 5:
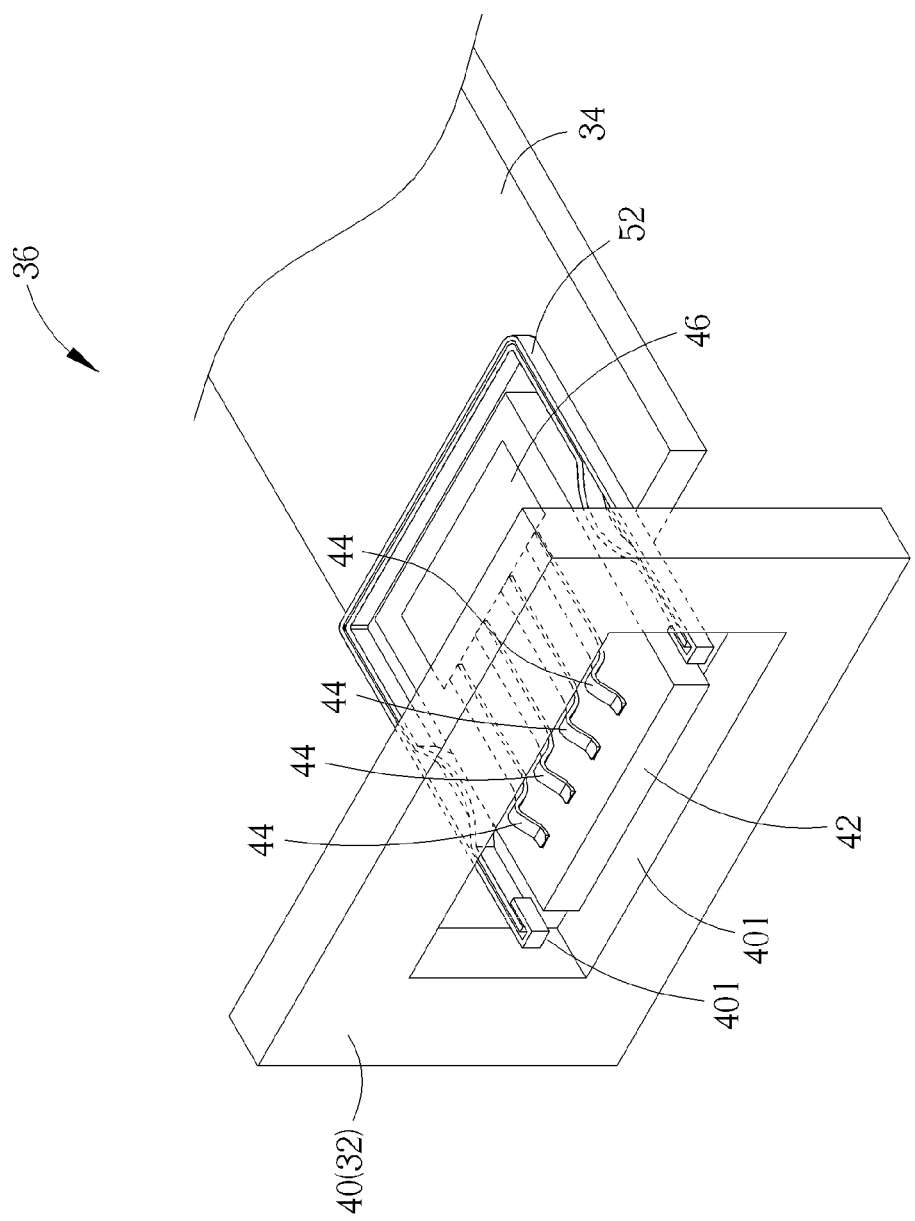
FIG. 5 is a diagram of the USB socket according to a third embodiment of the present invention.

Please refer to FIG. 5. FIG. 5 is a diagram of the USB socket 36 according to a third embodiment of the present invention. The USB socket 36 can further include at least one buckling structure 52 disposed inside the casing 32 and adjacent to the piercing structure 40. The buckling component 52 can be a curved unit disposed on an upper surface of the substrate 42. When the USB plug 38 inserts into the piercing structure 40 to electrically connect to the substrate 42, the buckling structure 52 can fasten the opposite sides of the USB plug 38 with the substrate 42 to prevent the separation of the USB plug 38 from the piercing structure 40. As shown in FIG. 5, the buckling structure 52 preferably provides force on the left and right sides of the USB plug 38 to reduce the height of the USB socket 36, so that the USB socket 36 of the present invention can be widely applied to the thin-type electronic device 30.

Figure 6:
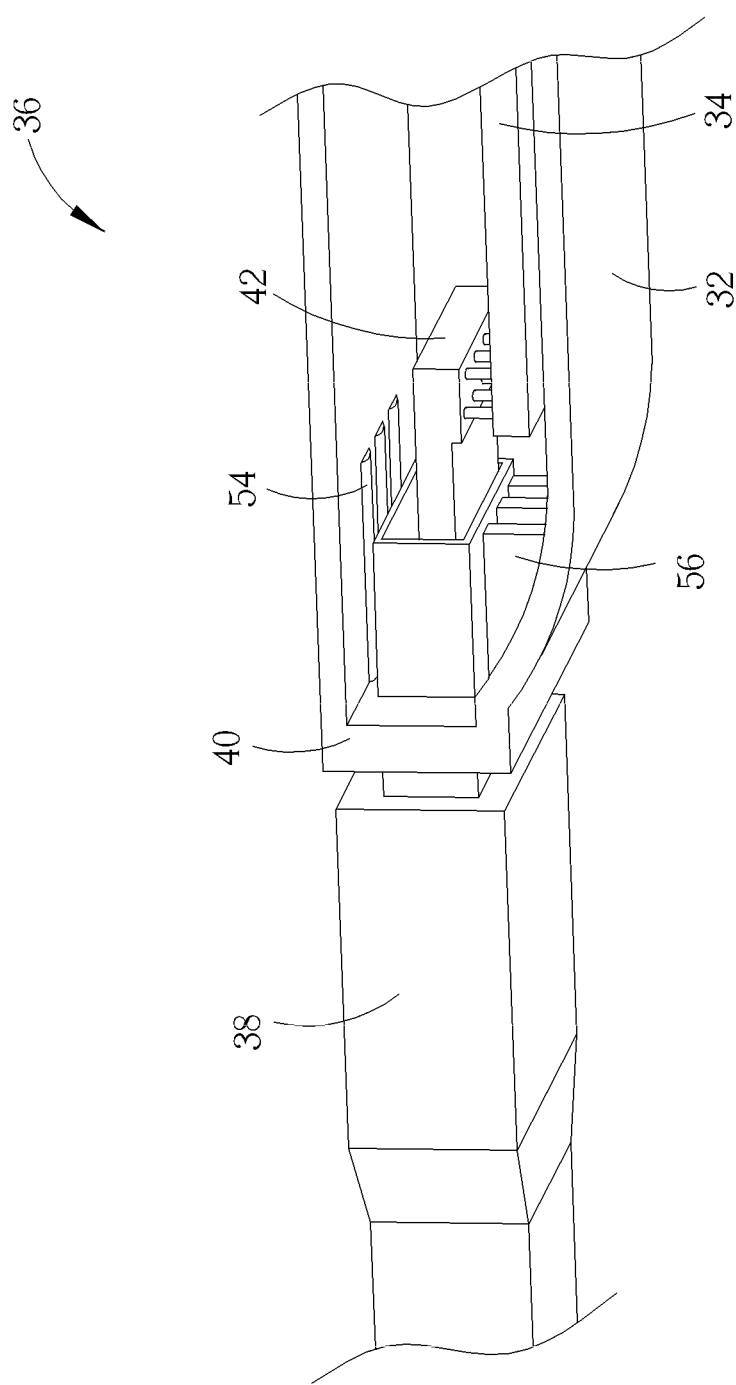
FIG. 6 is a sectional view of the USB socket according to a fourth embodiment of the present invention.

Please refer to FIG. 6. FIG. 6 is a sectional view of the USB socket 36 according to a fourth embodiment of the present invention. The USB socket 36 can further include a skidproof component 54 and a contacting structure 56. The skidproof component 54 and the contacting structure 56 are respectively disposed on different positions inside the casing 32 and adjacent to the piercing structure 40. For example, the skidproof component 54 is disposed on an upper side of the piercing structure 40, and the contacting structure 56 is disposed on a low side of the piercing structure 40. Disposition of the skidproof component 54 and the contacting structure 56 are not limited to the above-mentioned embodiment, and depend on design demand. Because a body of the USB plug 38 is longer, the piercing structure 40 only buckles a rear portion of the USB plug 38, so the fourth embodiment further utilizes the skidproof component 54 and the contacting structure 56 to respectively contact against the upper side and the low side of the USB plug 38, to ensure that the USB plug 38 can be electrically connected to the USB socket 36 stably.

Figure 7:
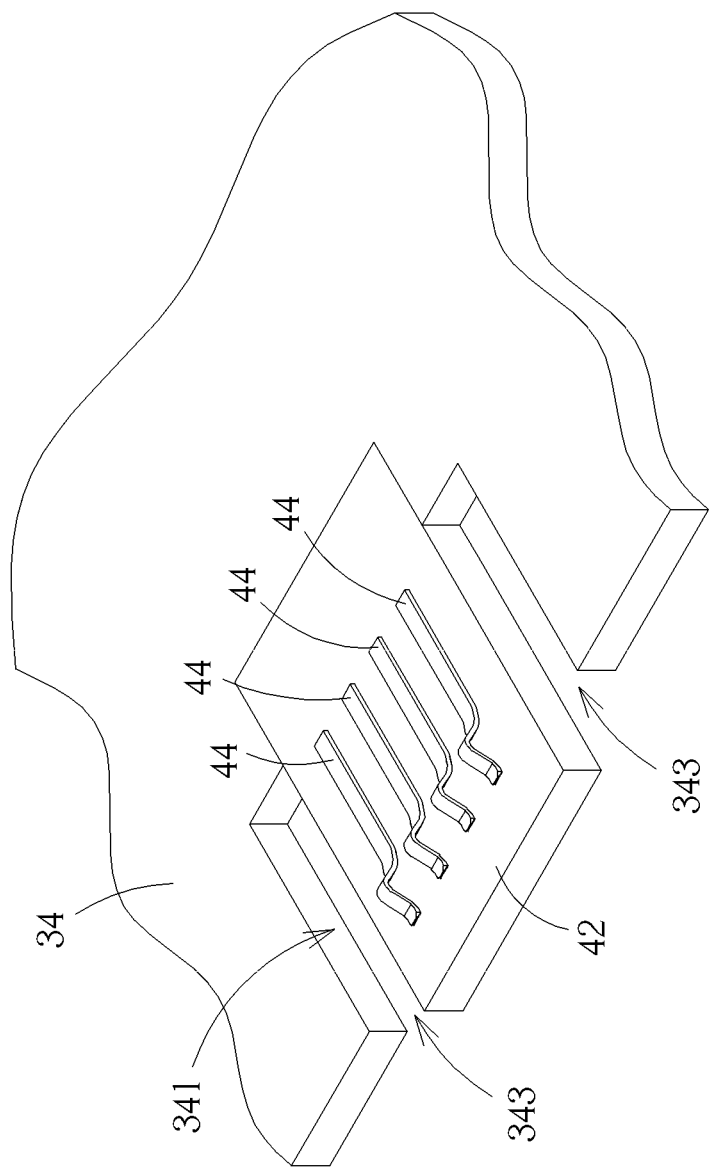
FIG. 7 is a diagram of the electronic device according to the other embodiment of the present invention.

Beside, the USB socket 36 of the present invention can utilize a structural design of the main board 34 to buckle the USB plug 38. Please refer to FIG. 7. FIG. 7 is a diagram of the electronic device 30 according to the other embodiment of the present invention. An opening structure 341 can be disposed on a side of the main board 34, and the substrate 42 is disposed inside the opening structure 341. A width of the opening structure 141 can be substantially greater than a width of the substrate 42, and slots 343 can be formed between the main board 34 and the substrate 42. As shown in FIG. 7, the USB plug 38 can be buckled by the substrate 42 and the lateral wall of the opening structure 341 when the USB plug 38 is electrically connected to the substrate 42, so as to stably fix the USB plug 38 with the piercing structure 40.

In conclusion, the substrate of the USB socket of the present invention is suspended inside the piercing structure, which means the substrate does not contact the internal walls of the piercing structure. The USB socket of the present invention utilizes the internal walls of the piercing structure, the resilient pad, the constraining structure, the buckling structure, the skidproof component and the contacting structure to stably fasten the USB plug instead of using extra covering components. Therefore, the present invention not only can effectively prevent the separation of the USB plug from the USB socket due to accident hit, but also can decrease dimensions of the USB socket according to specific structural design, so that the USB socket of the present invention can be preferably applied to the thin-type electronic device.

Comparing to the prior art, the present invention simplifies structure of the conventional socket, which means the present invention utilizes the casing of the electronic device to provide constraint on the USB plug. The present invention can decrease the structural dimensions of the USB socket, such as the thickness and the height of the USB socket, so as to economize inner space of the electronic device, and the electronic device of the present invention can conform to the market trend of thin-type computer for preferred competition.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A universal serial bus (USB) socket of an electronic device comprising:
   a piercing hole structure defined on a lateral wall of a casing of the electronic device wherein the electronic device has an input interface and a display screen, and the casing being an exterior cover whereon the input interface and/or the display screen is disposed;
   a substrate disposed on a main board of the casing and located inside the piercing hole structure, an integrated circuit being disposed on a surface of the substrate, wherein a USB plug is clamped by edges of the lateral wall of the casing, and the USB plug makes contact with only the lateral wall of the casing and the substrate; and
   a plurality of terminals disposed on the substrate and electrically connected to the integrated circuit;
   wherein the USB plug is electrically connected to the substrate and the terminals when the USB plug inserts into the piercing hole structure.

2. The USB socket of claim 1, wherein an aperture of the piercing structure is substantially equal to dimensions of the USB plug.

3. The USB socket of claim 1, wherein the USB socket further comprises:
   a constraining structure disposed on a side of the substrate, the constraining structure contacting against the USB plug to constrain a movement of the USB plug relative to the substrate.

4. The USB socket of claim 1, wherein the USB socket further comprises:
   a buckling structure disposed inside the piercing structure, the buckling structure fastening the USB plug with the substrate.

5. The USB socket of claim 1, wherein the USB socket further comprises:
   at least one resilient pad disposed on the internal wall of the piercing structure, a thickness of the resilient pad being substantially greater than a distance between the USB plug and the internal wall.

6. The USB socket of claim 1, wherein the USB socket further comprises:
   a skidproof component disposed inside the piercing structure, the skidproof component contacting against an upper side of the USB plug when the USB plug inserts into the piercing structure.

7. The USB socket of claim 6, wherein the USB socket further comprises:
   a contacting structure disposed inside the piercing structure, the contacting structure contacting against a low side of the USB plug.

8. An electronic device with universal serial bus (USB) connection, the electronic device comprising:
   a casing whereon an input interface and/or a display screen is disposed, being an exterior cover of the electronic device comprising the input interface and the display screen;
   a main board disposed inside the casing; and
   a USB socket disposed on the casing for connecting to a USB plug, the USB socket comprising:
      a piercing hole structure defined on a lateral wall of the casing;
      a substrate disposed on the main board and located inside the piercing hole structure, an integrated circuit being disposed on a surface of the substrate, wherein a USB plug is clamped by edges of the lateral wall of the casing, and the USB plug makes contact with only the lateral wall of the casing and the substrate; and
      a plurality of terminals disposed on the substrate and electrically connected to the integrated circuit;
      wherein the USB plug is electrically connected to the substrate and the terminals when the USB plug inserts into the piercing hole structure.

9. The electronic device of claim 8, wherein an opening structure is disposed on a side of the main board, the substrate is disposed inside the opening structure, and the USB plug is locked by the main board and a lateral wall of the opening structure.

10. The electronic device of claim 8, wherein an aperture of the piercing structure is substantially equal to dimensions of the USB plug.

11. The electronic device of claim 8, wherein the USB socket further comprises:
    a constraining structure disposed on a side of the substrate, the constraining structure contacting against the USB plug to constrain a movement of the USB plug relative to the substrate.

12. The electronic device of claim 8, wherein the USB socket further comprises:
    a buckling structure disposed inside the casing and adjacent to the piercing structure, the buckling structure fastening the USB plug with the substrate.

13. The electronic device of claim 8, wherein the USB socket further comprises:
    at least one resilient pad disposed on the internal wall of the piercing structure, a thickness of the resilient pad being substantially greater than a distance between the USB plug and the internal wall.

14. The electronic device of claim 8, wherein the USB socket further comprises:
    a skidproof component disposed inside the casing and adjacent to the piercing structure, the skidproof component contacting against an upper side of the USB plug when the USB plug inserts into the piercing structure.

15. The electronic device of claim 14, wherein the USB socket further comprises:
    a contacting structure disposed inside the casing and adjacent to the piercing structure, the contacting structure contacting against a low side of the USB plug.

16. The USB socket of claim 1, wherein an aperture is formed on the piercing structure, a front end of the substrate is surrounded by the aperture, and a rear end of the substrate is disposed on a main board inside of the casing and not sheltered by the piercing structure.

17. The electronic device of claim 8, wherein an aperture is formed on the piercing structure, a front end of the substrate is surrounded by the aperture, and a rear end of the substrate is disposed on the main board and not sheltered by the piercing structure.

* * * * *